United States Patent
Kitajima

(10) Patent No.: US 7,964,469 B2
(45) Date of Patent: Jun. 21, 2011

(54) METHOD OF MANUFACTURING SEMICONDUCTOR DEVICE HAVING RESISTOR FORMED OF A POLYCRYSTALLINE SILICON FILM

(75) Inventor: Yuichiro Kitajima, Chiba (JP)

(73) Assignee: Seiko Instruments Inc. (JP)

( * ) Notice: Subject to any disclaimer, the term of this patent is extended or adjusted under 35 U.S.C. 154(b) by 849 days.

(21) Appl. No.: 11/705,678

(22) Filed: Feb. 13, 2007

(65) Prior Publication Data
US 2007/0200200 A1   Aug. 30, 2007

(30) Foreign Application Priority Data

Feb. 22, 2006 (JP) .................. 2006-044816
Feb. 22, 2006 (JP) .................. 2006-044817
Jan. 12, 2007 (JP) .................. 2007-003995

(51) Int. Cl.
*H01L 21/20* (2006.01)
(52) U.S. Cl. ........ 438/384; 257/359; 257/380; 257/543; 257/581; 382/171; 382/190; 382/210; 382/238; 382/329; 382/330; 382/381
(58) Field of Classification Search .................. 257/536, 257/359, 380, 543, 581; 438/384, 382, 381, 438/330
See application file for complete search history.

(56) References Cited

U.S. PATENT DOCUMENTS
4,759,836 A * 7/1988 Hill et al. ................. 204/192.21

FOREIGN PATENT DOCUMENTS
JP              09-307062      * 11/1997
* cited by examiner

*Primary Examiner* — Marcos D. Pizarro
*Assistant Examiner* — Eva Yan Montalvo
(74) *Attorney, Agent, or Firm* — Adams & Wilks

(57) ABSTRACT

In a method of manufacturing a semiconductor device, a first oxide film is formed in a convex shape on a field insulating film, a polycrystalline silicon film is formed on the first oxide film, and impurities are introduced into the polycrystalline silicon film. The polycrystalline silicon film into which the impurity is introduced is patterned so that a portion above the convex-shaped first oxide film becomes a resistance region of the resistor. A second oxide film is then formed on the patterned polycrystalline silicon film followed by the formation of a third oxide film on the second oxide film. The third oxide film and parts of the second oxide film and the polycrystalline silicon film are then removed to form a planarized surface including surface portions of the second oxide film and the polycrystalline silicon film.

12 Claims, 14 Drawing Sheets

Prior Art

METHOD OF MANUFACTURING SEMICONDUCTOR DEVICE HAVING RESISTOR FORMED OF A POLYCRYSTALLINE SILICON FILM

BACKGROUND OF THE INVENTION

1. Field of the Invention

The present invention relates to a semiconductor device with a resistor formed from polycrystalline silicon film and having high resistivity with a small area.

2. Description of the Related Art

In an analog semiconductor device, a resistor is widely used as an important device. Constructing a resistor from polycrystalline silicon film, the resistor is required to have the minimum width and thickness of the polycrystalline silicon film should be thin so as to obtain a desired resistance with a small area. The width of the resistor is, however, determined by accuracy of process. In addition, when the thickness of the film is thin, there arises a problem in that over-etching of the polycrystalline silicon film and penetration to the underlying structure occur in an etching process for making an opening for contact in an electrode lead-out region.

As a countermeasure for the problem described above, as shown in FIG. 15, a field insulating film 201 is formed on a semiconductor substrate 101, and a resistor portion formed thereon is constituted of a second polycrystalline silicon film 303 whose film thickness is thin. In order to prevent the over-etching and penetration at a portion in which an opening for contact is made, there is a method of providing a first polycrystalline silicon film 302 whose thickness is thick and an oxide film 206 formed thereon under the second polycrystalline silicon film 303. (For example, see JP 06-69207 A)

There is another conventional method by which a region of a polycrystalline silicon film which becomes a resistor is subjected to thermal oxidation, which makes the film thickness thin and increases the resistivity thereof, while the thickness of the polycrystalline silicon film at the electrode lead-out region is kept thick, to thereby prevent the over-etching and penetration upon making an opening for contact. (For example, see JP2004-140062 A)

In the invention described in JP 06-69207 A, electrical coupling between a second polycrystalline silicon film and a first polycrystalline silicon film is performed through contact of a side surface of the first polycrystalline silicon film with the second polycrystalline silicon film. In this case, there arises a problem in that preferable electrical coupling cannot be obtained without sufficient removal of polymer or reaction product formed on a side wall of the first polycrystalline silicon film at the time of etching of the first polycrystalline silicon film, and of natural oxide film formed on the first polycrystalline silicon film before the deposition of the second polycrystalline silicon film.

Further, in the invention described in JP 2004-140062 A, thermal oxidation is employed to make the polycrystalline silicon film, which becomes a resistor, into a thin film. There arises a problem in that, in a case of making a transistor on the same semiconductor substrate as that for the resistor with the use of a polycrystalline silicon film obtained by adding a p-type impurity such as boron for a gate electrode, the impurity introduced in the polycrystalline silicon film is rediffused into a channel region of the transistor, and causes a threshold voltage shift of the transistor and increases instability of the transistor, in thermal oxidation performed after formation of the gate electrode.

SUMMARY OF THE INVENTION

In order to solve the above-mentioned problems, the present invention provides the following means.

(1) There is provided a semiconductor device including a resistor formed on the base insulating film, the resistor being formed of a polycrystalline silicon film and having a resistance region and electrode lead-out regions formed at both ends of the resistance region, in which: a portion of the base insulating film below the resistance region of the resistor projects with respect to portions of the base insulating film below the electrode lead-out regions of the resistor so that a height difference occurs therebetween; and the resistor is processed from a surface side of the polycrystalline silicon film so that the resistance region has a thickness smaller than that of each of the electrode lead-out regions.

(2) In the semiconductor device, the resistor formed of the polycrystalline silicon film includes a second polycrystalline silicon film; and the height difference is formed of a first polycrystalline silicon film below the base insulating film.

(3) In the semiconductor device, the height difference of the base insulating film is formed of an oxide film.

(4) There is provided a method of manufacturing a semiconductor device in which a resistor is formed of a second polycrystalline silicon film and a height difference of a base insulating film is formed of a first polycrystalline silicon film below the base insulating film, including the steps of: forming a base insulating film formed on the field insulating film a convex shape; forming a second polycrystalline silicon film on the base insulating film; introducing an impurity into the second polycrystalline silicon film; patterning the second polycrystalline silicon film; forming a second oxide film on the second polycrystalline silicon film; forming an SOG film on the second oxide film; and removing the second oxide film, the SOG film, and a part of the second polycrystalline silicon film.

(5) In the method of manufacturing the semiconductor device in which the resistor formed of the polycrystalline silicon film is formed of the second polycrystalline silicon film and the height difference of the base insulating film is formed of the first polycrystalline silicon film below the base insulating film, the step of forming a base insulating film formed on a polycrystalline silicon film into a convex shape includes the steps of: forming a first polycrystalline silicon film on a field insulating film; patterning so as to leave a portion of the first polycrystalline silicon film below a region of the resistor which becomes a high resistance; and forming a first oxide film.

(6) In the method of manufacturing the semiconductor device in which the resistor formed of the polycrystalline silicon film is formed of the second polycrystalline silicon film and the height difference of the base insulating film is formed of the first polycrystalline silicon film below the base insulating film, in the step of forming a second polycrystalline silicon film on the base insulating film, the second polycrystalline silicon film is formed so as to have a film thickness of from 100 nm to 200 nm.

(7) In the method of manufacturing the semiconductor device in which the resistor formed of the polycrystalline silicon film is formed of the second polycrystalline silicon film and the height difference of the base insulating film is formed of the first polycrystalline silicon film below the base insulating film, in the step of forming a base insulating film formed on a polycrystalline silicon film into a convex shape, the first polycrystalline silicon film is formed so as to have a film thickness of from 300 nm to 400 nm.

(8) There is provided a method of manufacturing a semiconductor device in which a resistor is formed of a polycrystalline silicon film and a height difference of a base insulating film is formed of an oxide film, including the steps of: forming a base insulating film formed on a polycrystalline silicon film into a convex shape; forming a polycrystalline silicon film on the base insulating film; introducing an impurity into the polycrystalline silicon film; patterning the polycrystalline silicon film; forming an oxide film on the polycrystalline silicon film; forming an SOG film on the oxide film; and removing the oxide film, the SOG film, and a part of the polycrystalline silicon film.

(9) In the method of manufacturing the semiconductor device in which a resistor is formed of a polycrystalline silicon film and a height difference of a base insulating film is formed of an oxide film, the step of forming a base insulating film formed on a polycrystalline silicon film into a convex shape includes the steps of: forming a first oxide film on a field insulating film; and patterning so as to leave a portion of the oxide film below a region of the resistor which becomes a high resistance.

(10) In the method of manufacturing the semiconductor device in which the resistor is formed of the polycrystalline silicon film and the height difference of the base insulating film is formed of the oxide film, in the step of forming a first oxide film on the field insulating film of the step of forming a base insulating film formed on a polycrystalline silicon film into a convex shape, the first oxide film is formed to have a thickness in a range from 100 nm to 400 nm.

(11) In the method of manufacturing the semiconductor device in which the resistor formed of the polycrystalline silicon film is formed of the second polycrystalline silicon film and the height difference of the base insulating film is formed of the first polycrystalline silicon film below the base insulating film, or in the method of manufacturing the semiconductor device in which a resistor is formed of a polycrystalline silicon film and a height difference of a base insulating film is formed of an oxide film, in the step of introducing an impurity into the polycrystalline silicon film which becomes the resistor, the impurity is introduced into the polycrystalline silicon film so as to have a concentration in about a range from $1 \times 10^{14}/cm^2$ to $5 \times 10^{15}/cm^2$.

(12) In the method of manufacturing the semiconductor device in which the resistor is formed of the polycrystalline silicon film and the height difference of the base insulating film is formed of an oxide film, in the step of forming the polycrystalline silicon film on the base insulating film, the polycrystalline silicon film is formed so as to have a film thickness of from 100 nm to 400 nm.

(13) In the method of manufacturing the semiconductor device in which the resistor formed of the polycrystalline silicon film is formed of the second polycrystalline silicon film and the height difference of the base insulating film is formed of the first polycrystalline silicon film below the base insulating film, or in the method of manufacturing the semiconductor device including the resistor formed of the polycrystalline silicon film in which the height difference of the base insulating film is formed by the oxide film, the resistance region of the resistor formed of the polycrystalline silicon film has a final film thickness in a range from 10 nm to 100 nm.

(14) There is provided a semiconductor device including: at least two resistors; at least two fuse devices each of which is connected in parallel with each of the resistors; and a bleeder resistance circuit for adjusting a voltage output which is divided by the resistors through cutting-off of the fuse device, in which: the resistors are each formed of a polycrystalline silicon film and have a resistance region and electrode lead-out regions formed at both ends of the resistance region which are formed on the base insulating film; and the resistors are each polished from a surface side of the polycrystalline silicon film such that: the base insulating film includes portions having a height difference such that a portion below the resistance region projects with respect to portions below the electrode lead-out regions; and the resistance region has a thickness smaller than that of each of the electrode lead-out regions.

According to the present invention, there is provided a semiconductor device including a highly precise resistor formed of a polycrystalline silicon film, and a method of manufacturing the same, in which a base insulating film of the polycrystalline silicon film which becomes a resistance region has a convex shape, the polycrystalline silicon film which becomes the resistor is selectively formed into a thin film, while an electrode lead-out region remains thick so as to prevent penetration at the opening for contact, thereby providing a resistor which has high precision, high resistivity, and a preferable temperature coefficient.

DETAILED DESCRIPTION OF THE PREFERRED EMBODIMENTS

Hereinafter, preferred embodiments of a semiconductor device according to the present invention will be described with reference to the attached drawings.

Embodiment 1

FIGS. 1 to 7 show a semiconductor device and a method of manufacturing the same according to a first embodiment of the present invention.

Figure 1:
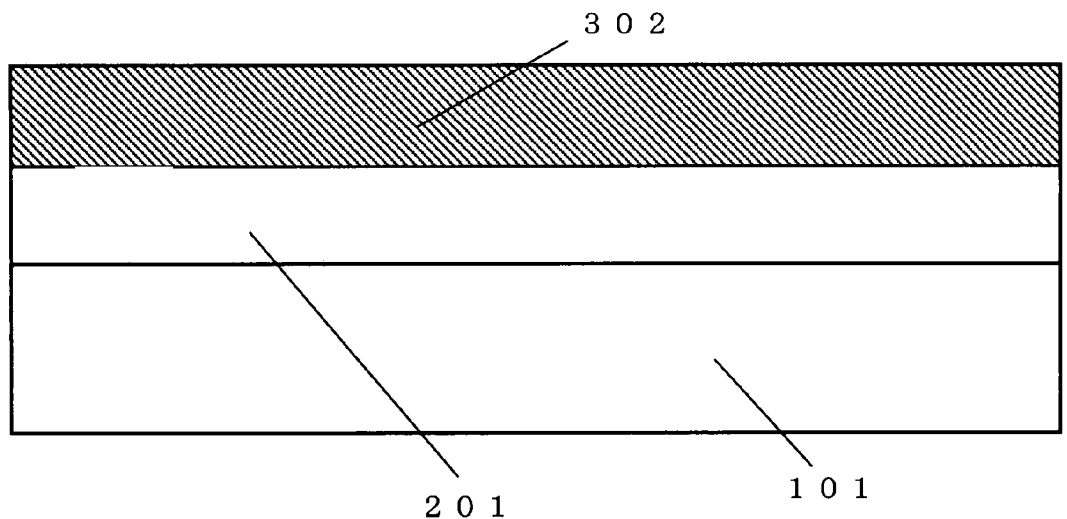
FIG. 1 is a schematic sectional view showing a first embodiment of a method of manufacturing a semiconductor device according to the present invention.

As shown in FIG. 1, a field insulating film 201, which is a device isolation region, is formed on a semiconductor substrate 101, and then a first polycrystalline silicon film 302 is deposited thereon by chemical vapor deposition (CVD). The polycrystalline silicon film 302 has a film thickness of about 300 nm to 400 nm, which is relatively thick. When the polycrystalline silicon film 302 shown in FIG. 1 also works as a gate electrode of a MOS transistor formed in another region on the semiconductor substrate 101 or as a wiring layer, impurity is introduced into the first polycrystalline silicon film 302 by employing, for example, an ion implantation method or a solid phase diffusion method.

Figure 2:
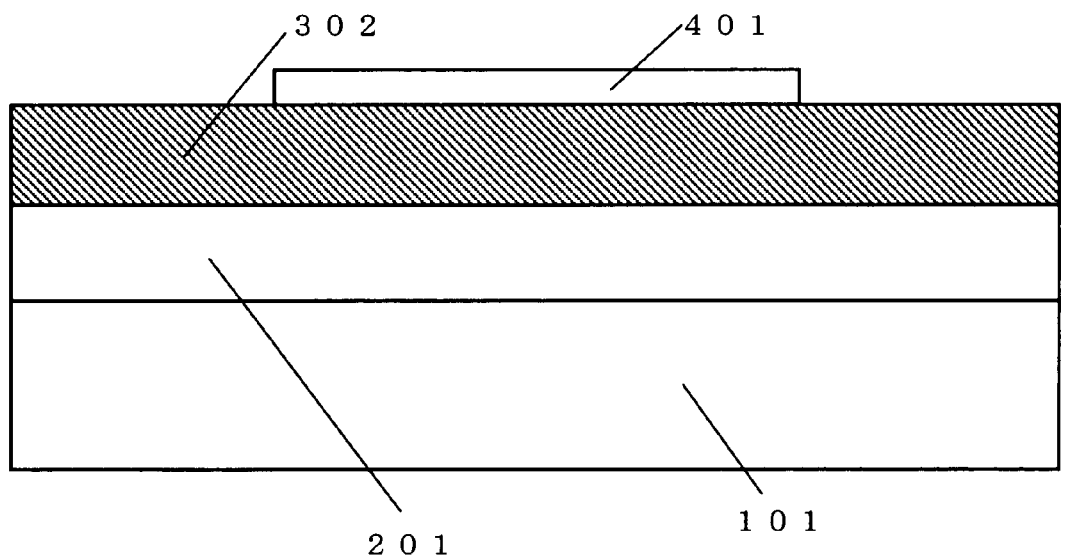
FIG. 2 is a schematic sectional view showing the first embodiment of the method of manufacturing a semiconductor device according to the present invention.

Next, as shown in FIG. 2, a photo resist 401 is patterned to be open outside the vicinity of the resistor in a photolithography process so that portions of the first polycrystalline silicon film 302 other than a portion which becomes a base of the resistance region of the resistor are to be removed. After that, by using the photo resist 401 as a mask, the first polycrystalline silicon film 302 is etched, the photo resist 401 is removed, and then a first oxide film 202 which becomes a base insulating film is formed by thermal oxidation in, for example, an electric furnace. In this process, the first oxide film 202 may be formed by the CVD method.

Figure 3:
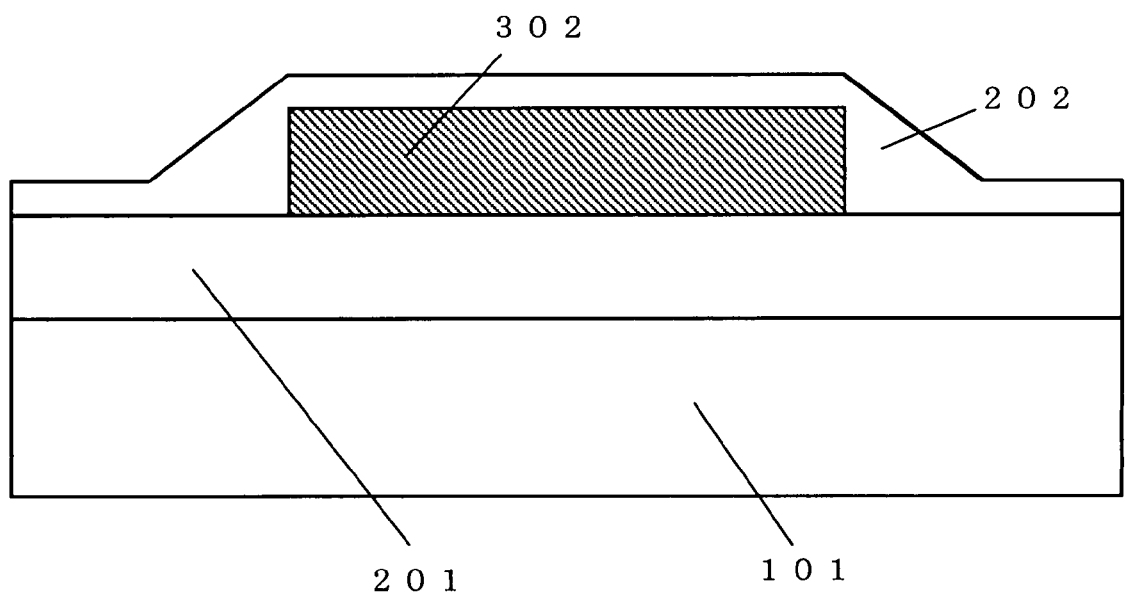
FIG. 3 is a schematic sectional view showing the first embodiment of the method of manufacturing a semiconductor device according to the present invention.

Through the above-mentioned processes, a structure is obtained in which a region where a high resistive portion of the resistor is to be formed becomes convex with respect to the other regions of the resistor as shown in FIG. 3.

Figure 4:
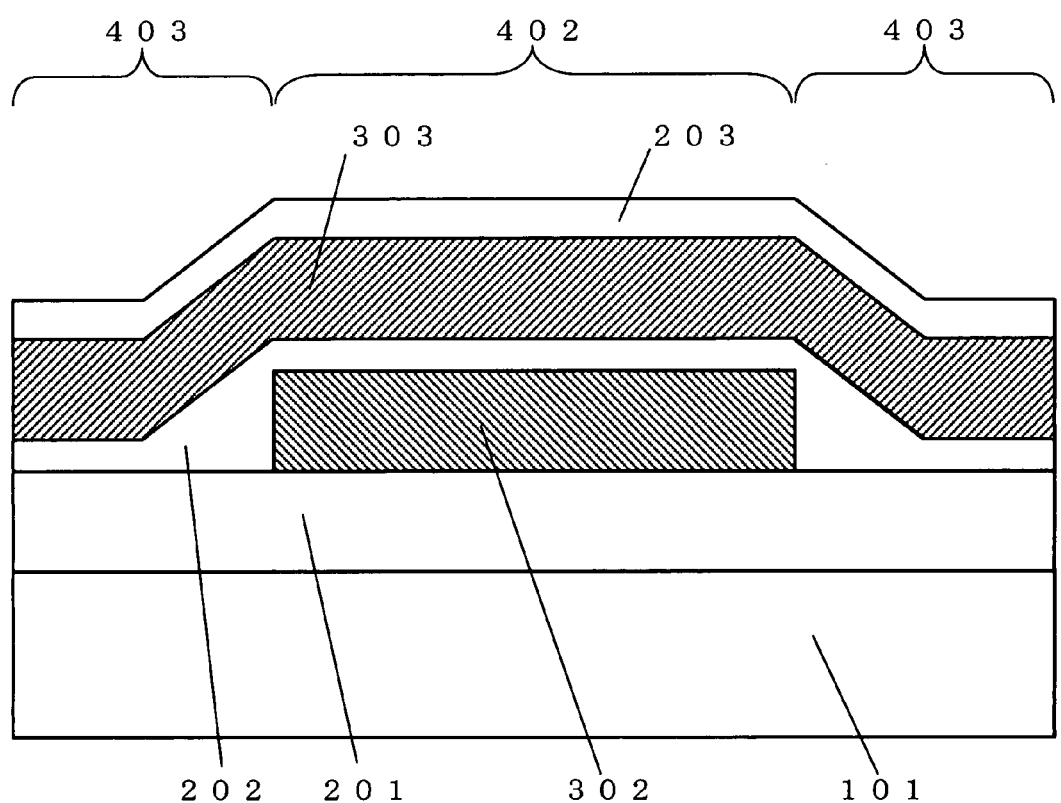
FIG. 4 is a schematic sectional view showing the first embodiment of the method of manufacturing a semiconductor device according to the present invention.

Next, as shown in FIG. 4, a second polycrystalline silicon film 303 is deposited on the first oxide film 202 by the CVD method, and then an oxide film 203 is formed by thermal oxidation in, for example, an electric furnace, or by the CVD method. Then, an impurity is introduced into the second polycrystalline silicon film 303 by the ion implantation method. The second polycrystalline silicon film has 303 a film thickness of 100 nm to 400 nm, preferably 100 nm to 200 nm. As an impurity, arsenic, phosphorus, or the like is used for an n-type resistor, and boron, BF2, or the like is used for a p-type resistor. The ion implantation is performed with a dosage in about a range from $1 \times 10^{14}/cm^2$ to $5 \times 10^{15}/cm^2$. In the process, in a case where it is necessary to introduce an impurity into electrode lead-out regions 403 shown in FIG. 4 with a high impurity concentration so as to reduce a contact resistance, and introduce an impurity into a resistance region 402 with a low impurity concentration so as to increase a sheet resistance, the second polycrystalline silicon film 303 is deposited on the first oxide film, and the oxide film 203 is formed thereon. After that, the impurity is introduced into the entire surface of the second polycrystalline silicon film 303 with a low concentration, and then a photo resist is patterned in a lithography process so that the each electrode lead-out regions 403 has an opening. Then, by using the photo resist as a mask, the impurity is introduced into the electrode lead-out regions 403 with a high concentration. In this case, the oxide film 203 is not necessarily formed.

Figure 5:
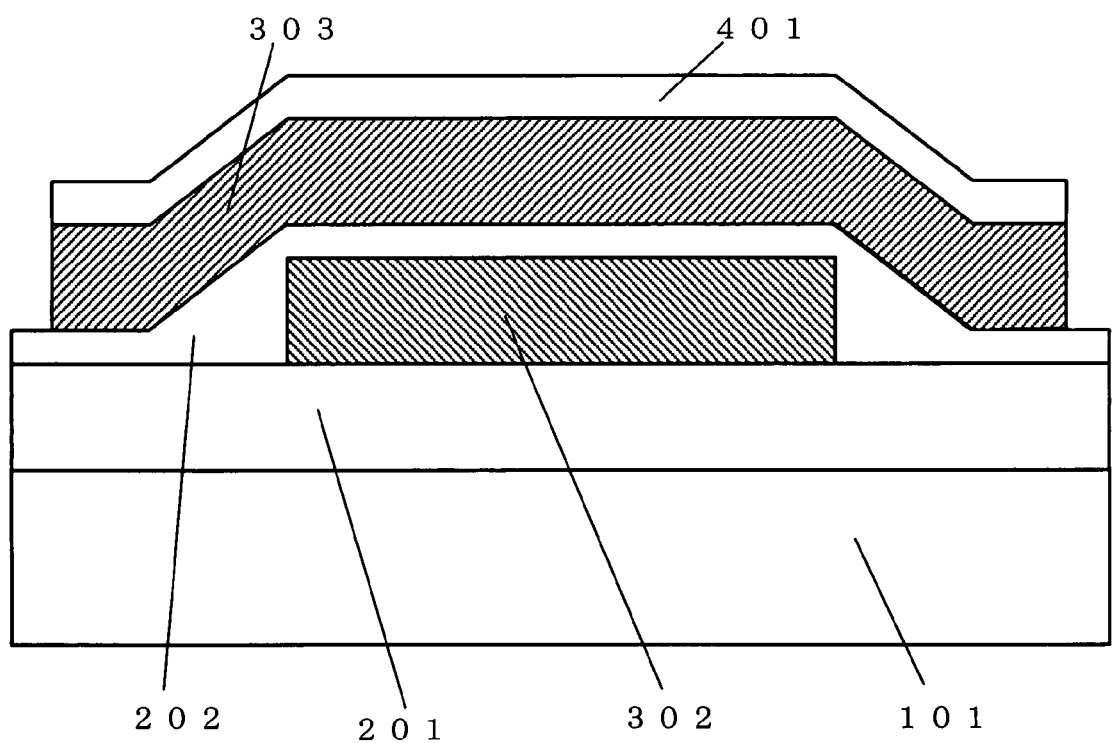
FIG. 5 is a schematic sectional view showing the first embodiment of the method of manufacturing a semiconductor device according to the present invention.

After that, the oxide film 203 is removed, and the photo resist 401 is patterned in the photolithography process so that portions of the second polycrystalline silicon film other than a portion which becomes the resistance region of the resistor are openings. Then, by using the photo resist 401 as a mask, the second polycrystalline silicon film 303 is etched. Thus, the structure shown in FIG. 5 is obtained.

Figure 6:
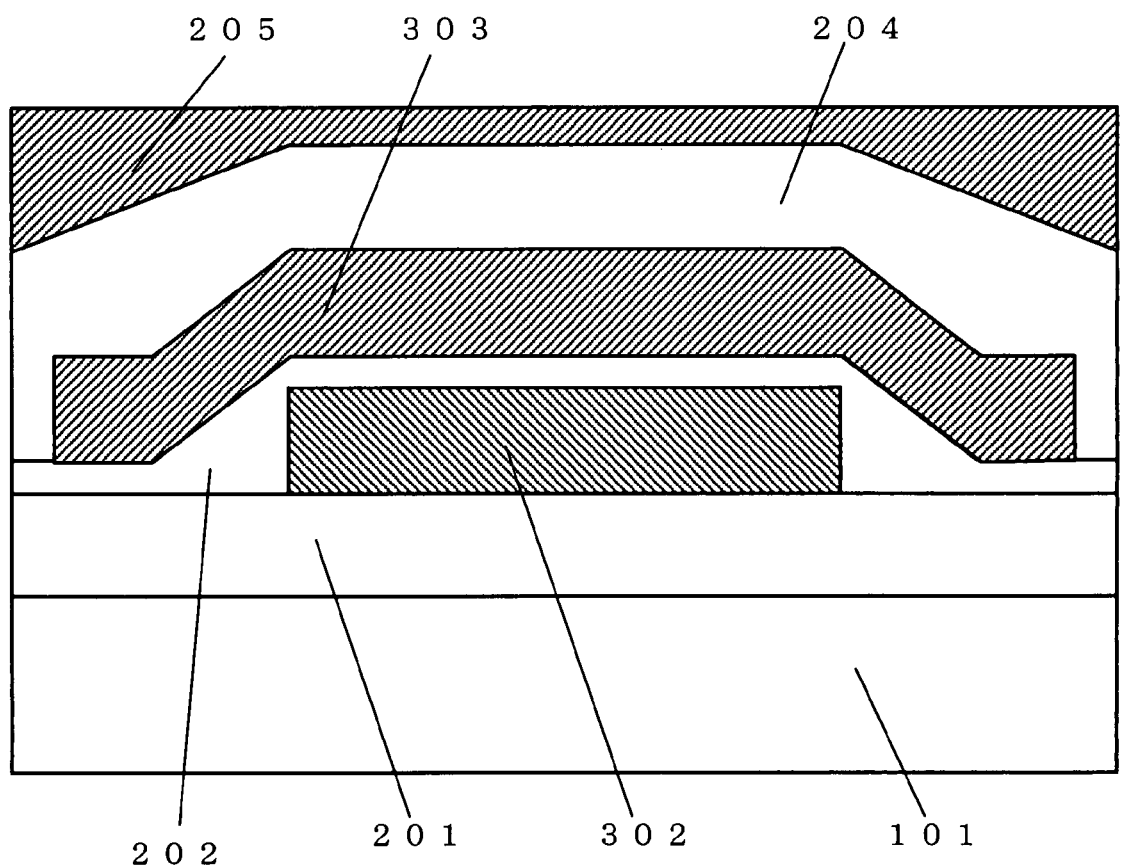
FIG. 6 is a schematic sectional view showing the first embodiment of the method of manufacturing a semiconductor device according to the present invention.

Next, after removing the photo resist 401, in order to employ the etch-back method, a TEOS-based oxide film 204 (second oxide film) is deposited by employing, for example, the CVD method, an SOG film 205 (third oxide film) is formed on the TEOS-based oxide film 204 to planarize the TEOS-based oxide film 204 on the second polycrystalline silicon film 303 as shown in FIG. 6, and then etching is performed. The etching is performed while adjusting each etching rate of the SOG film 205, the TEOS-based oxide film 204, and the second polycrystalline silicon film 303 so that the upper surface is flat after performing the etch-back. The etching is continuously performed until the second polycrystalline silicon film 303 in the resistance region 402 has a desired thickness. The second polycrystalline silicon film 303 in the resistance region 402 has a final thickness of about 10 nm to 90 nm, which depends on the thicknesses of deposited films. The etch-back method is performed after the patterning of the second polycrystalline silicon film 303, so there is an effect in that the resistor, irregularities caused in the process before formation of the resistor, and the like are planarized. More specifically, as shown in FIG. 7, by the removal of the SOG film 205, and by removing parts of the TEO-based oxide film 204 and the second polycrystalline silicon film 303 by the etch-back method as descibed above, the upper surface is formed into a planarized surface including surface portions of the TEO-based oxide film 204 and the second polycrystalline silicon film 303 corresponing to the electrode lead-out regions 403 and the resistance region 402, respectively.

Figure 7:
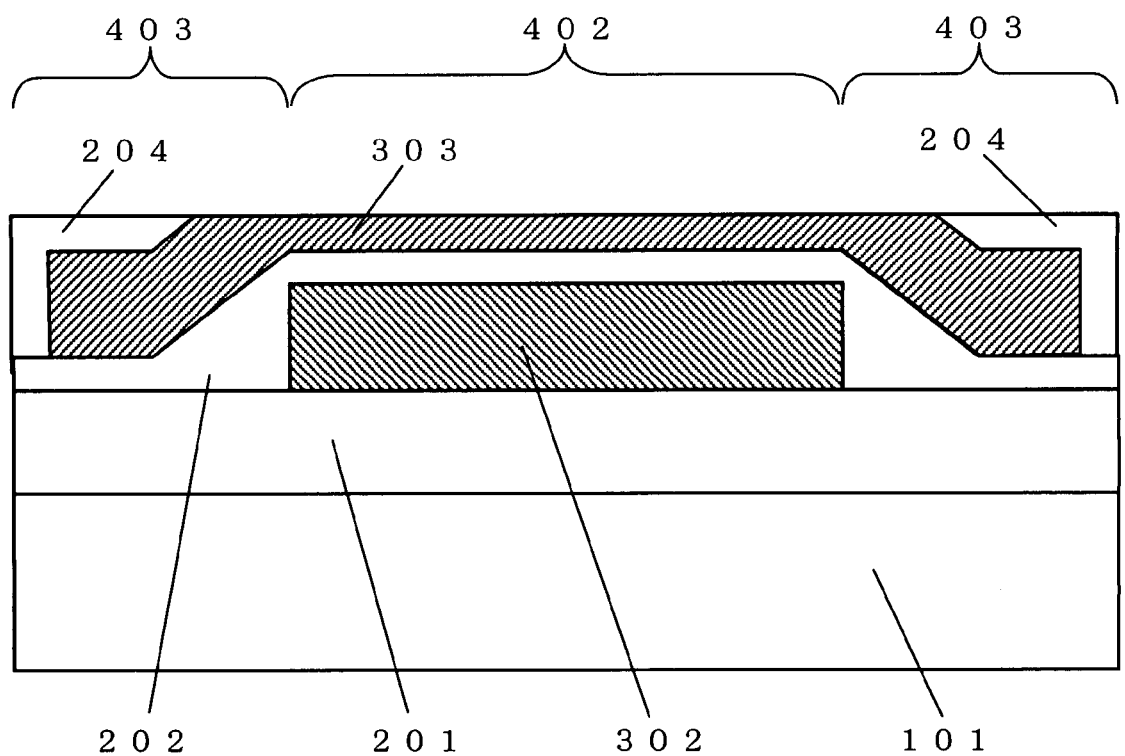
FIG. 7 is a schematic sectional view showing a first embodiment of a semiconductor device according to the present invention.

Through the above-mentioned processes, as shown in FIG. 7, on the field insulating film 201 formed on the semiconductor substrate 101, the first polycrystalline silicon film 302 is formed under the region of the resistor which becomes the resistance region 402. In addition, on the first oxide film 202, it is possible to obtain the structure of the resistor which is formed of the second polycrystalline silicon film 303 and includes the resistance region 402 and the electrode lead-out regions 403 such that the resistance region 402 is thinner than each of the electrode lead-out regions 403. Since each thickness of the electrode lead-out regions 403 is thick, there does not arise any problem of penetration in an opening for contact. Meanwhile, a resistor with a structure and characteristics having high accuracy, high resistivity, and a preferable temperature characteristic can be obtained. In addition, it is possible to use the resistor as a resistor for a semiconductor device including not a single resistor but two or more resistors, fuse devices each of which is connected in parallel with each of the resistors, and a bleeder resistance circuit capable of adjusting a voltage output which is divided by the resistors through cutting-off of the fuse devices by laser trimming or the like. The resistor and the regions for contact openings are formed as a continuum, and there is no need to perform a heat treatment process causing re-diffusion of an impurity, accordingly there is not any risk of raising problems of the conventional manufacturing method.

In this embodiment, as a manufacturing method for obtaining the structure shown in FIG. 7 from the structure shown in FIG. 6, the etch-back method by means of etching is employed. Alternatively, a chemical mechanical polishing (CMP) method may be employed to perform polishing and planarization, thereby making it possible to easily obtain the structure shown in FIG. 7.

Embodiment 2

Next, a semiconductor device and a method of manufacturing the same according to a second embodiment of the present invention will be described with reference to FIGS. 8 to 14.

Figure 8:
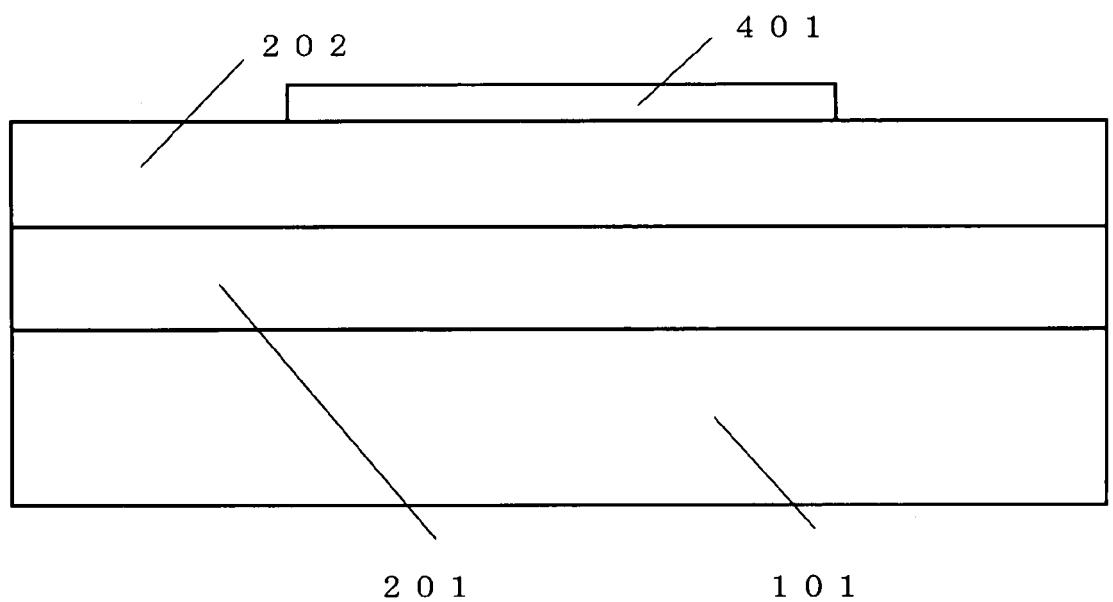
FIG. 8 is a schematic sectional view showing a second embodiment of a method of manufacturing a semiconductor device according to the present invention.
Figure 9:
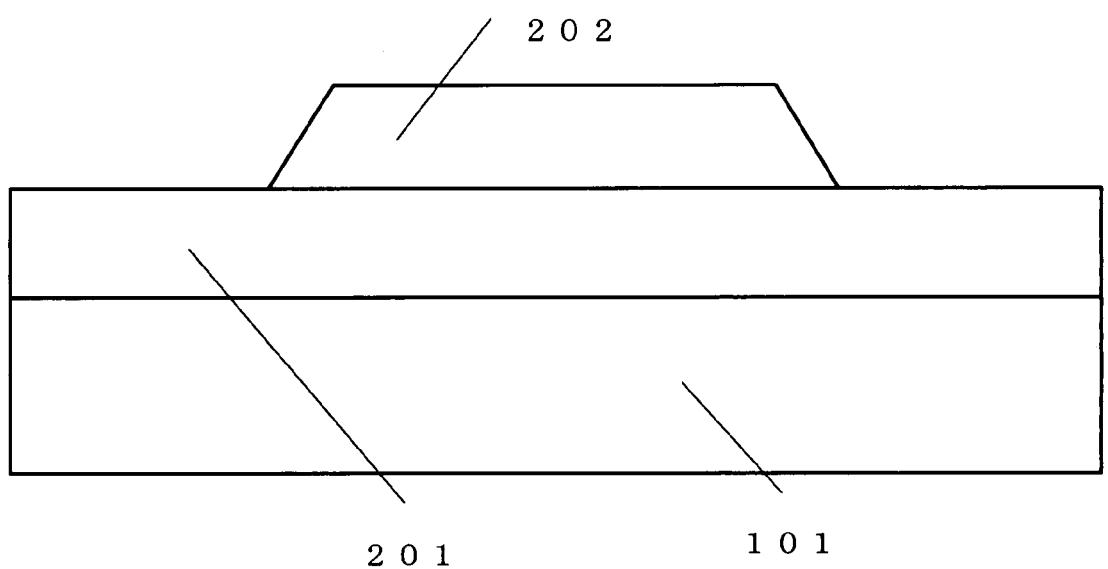
FIG. 9 is a schematic sectional view showing the second embodiment of the method of manufacturing a semiconductor device according to the present invention.

As shown in FIG. 8, the field insulating film 201, which is a device isolation region, is formed on the semiconductor substrate 101, and then a first oxide film 202 which becomes a base insulating film is deposited thereon by the CVD method with a thickness of about 100 nm to 400 nm. Then, the photo resist 401 is patterned in the photolithography process so that portions of the first oxide film 202 other than a portion which becomes a base of the resistance region of the resistor are openings. Then, by using the photo resist 401 as a mask, the first oxide film 202 is etched, and the photo resist 401 is removed. The structure thus obtained is shown in FIG. 9.

Through the above-mentioned processes, it is possible to obtain a structure in which a region where a high resistivity portion of the resistor is to be formed becomes convex with respect to the other regions of the resistor.

Figure 10:
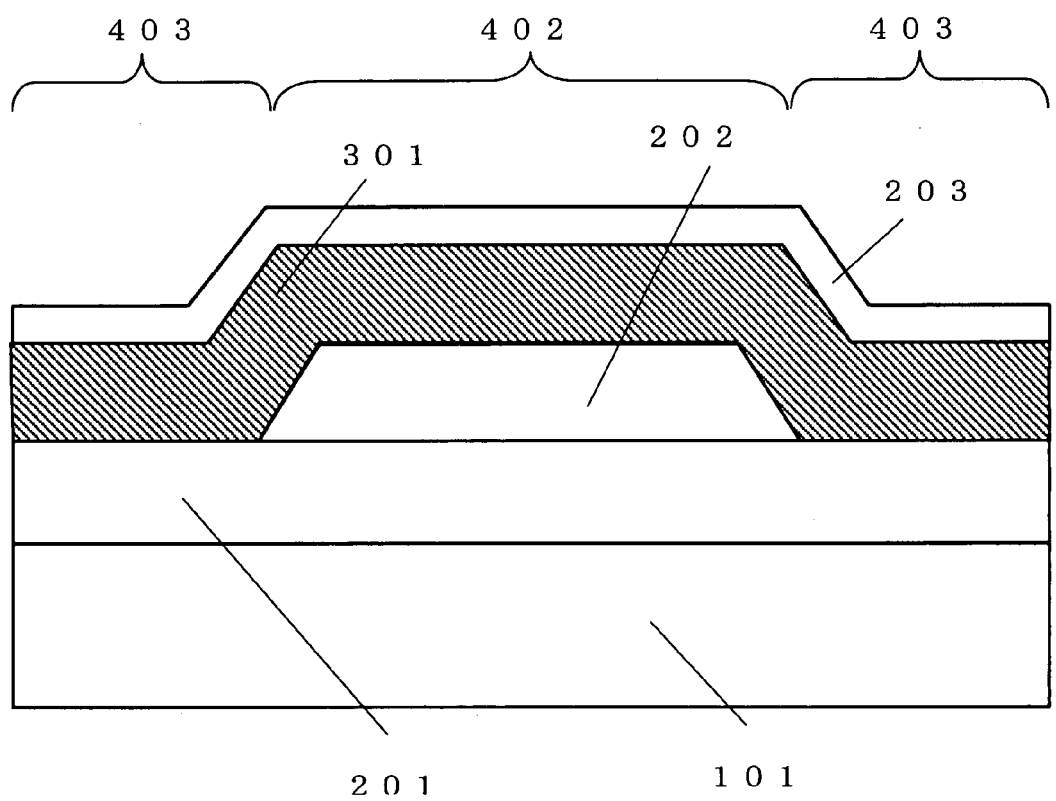
FIG. 10 is a schematic sectional view showing the second embodiment of the method of manufacturing a semiconductor device according to the present invention.
Figure 11:
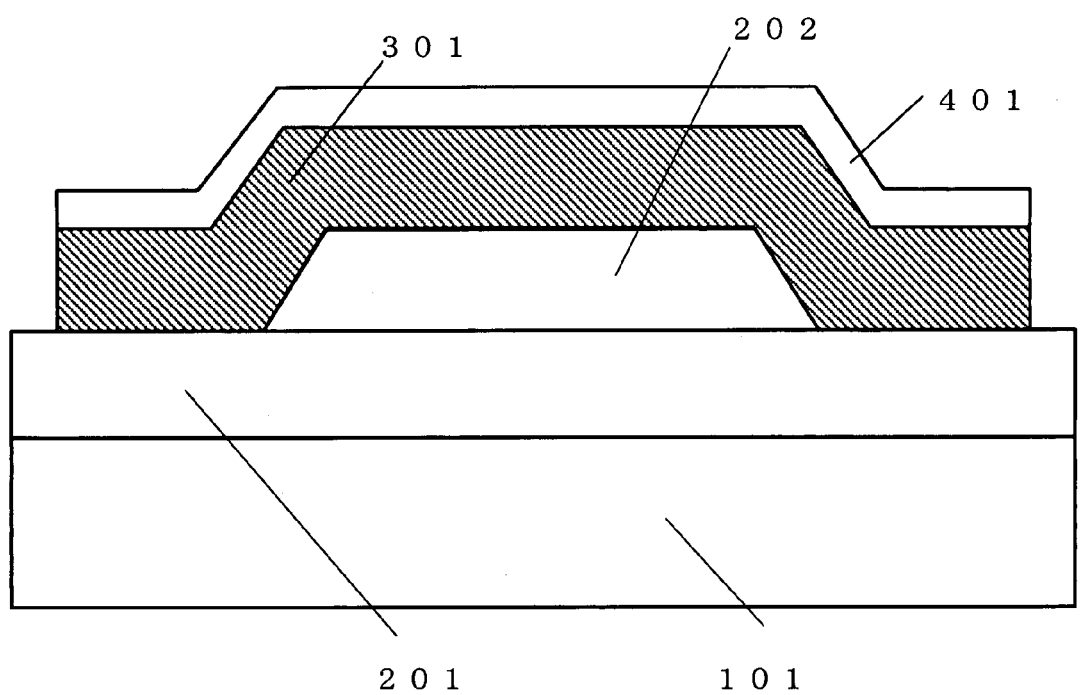
FIG. 11 is a schematic sectional view showing the second embodiment of the method of manufacturing a semiconductor device according to the present invention.

Next, as shown in FIG. 10, a polycrystalline silicon film 301 is deposited on a first oxide film 202 by the CVD method, and then an oxide film 203 is formed by thermal oxidation in, for example, an electric furnace, or by the CVD method. Then, an impurity is introduced into the polycrystalline silicon film 301 by the ion implantation method. The polycrystalline silicon film 301 has a film thickness of 100 nm to 400 nm. As an impurity, arsenic, phosphorus, or the like is used for an n-type resistor, and boron, $BF_2$, or the like is used for a p-type resistor. The ion implantation is performed with a dosage in about a range from $1\times10^{14}/cm^2$ to $5\times10^{15}/cm^2$. In the process, in a case where it is necessary to introduce an impurity into electrode lead-out regions 403 shown in FIG. 10 with a high impurity concentration so as to reduce a contact resistance, and introduce an impurity into a resistance region 402 with a low impurity concentration so as to increase a resistance, the polycrystalline silicon film 301 is deposited on the first oxide film, and the sacrificial oxide film 203 is formed thereon. After that, the impurity is introduced into the entire surface of the second polycrystalline silicon film 303 with a low concentration, and then a photo resist is patterned in the lithography process so that each of the electrode lead-out regions 403 has an opening. Then, by using the photo resist as a mask, the impurity is introduced into the electrode lead-out regions 403 with a high concentration. In this case, the sacrificial oxide film 203 is not necessarily formed.

Figure 14:
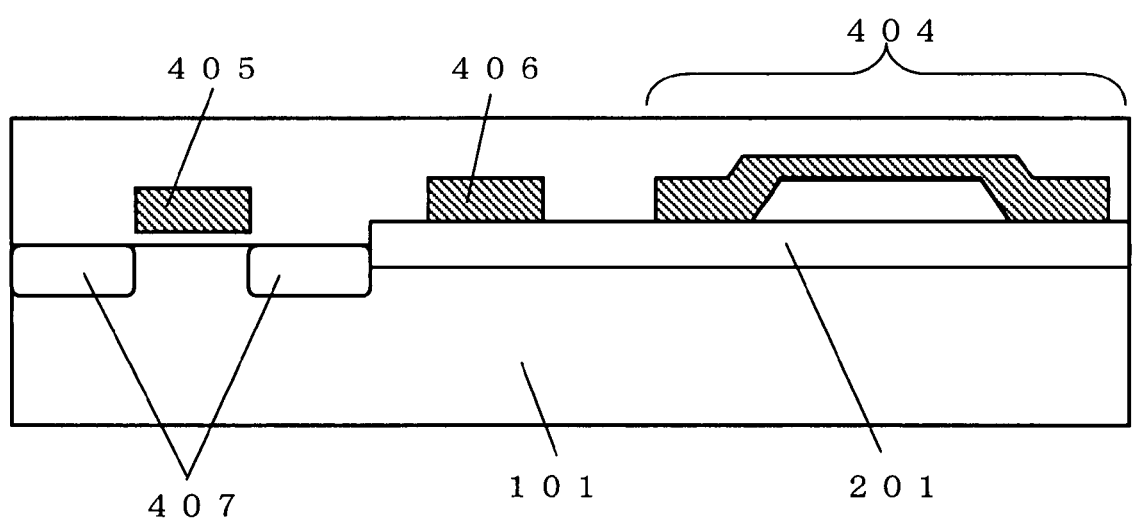
FIG. 14 is a schematic sectional view showing the second embodiment of the semiconductor device according to the present invention.
Figure 15:
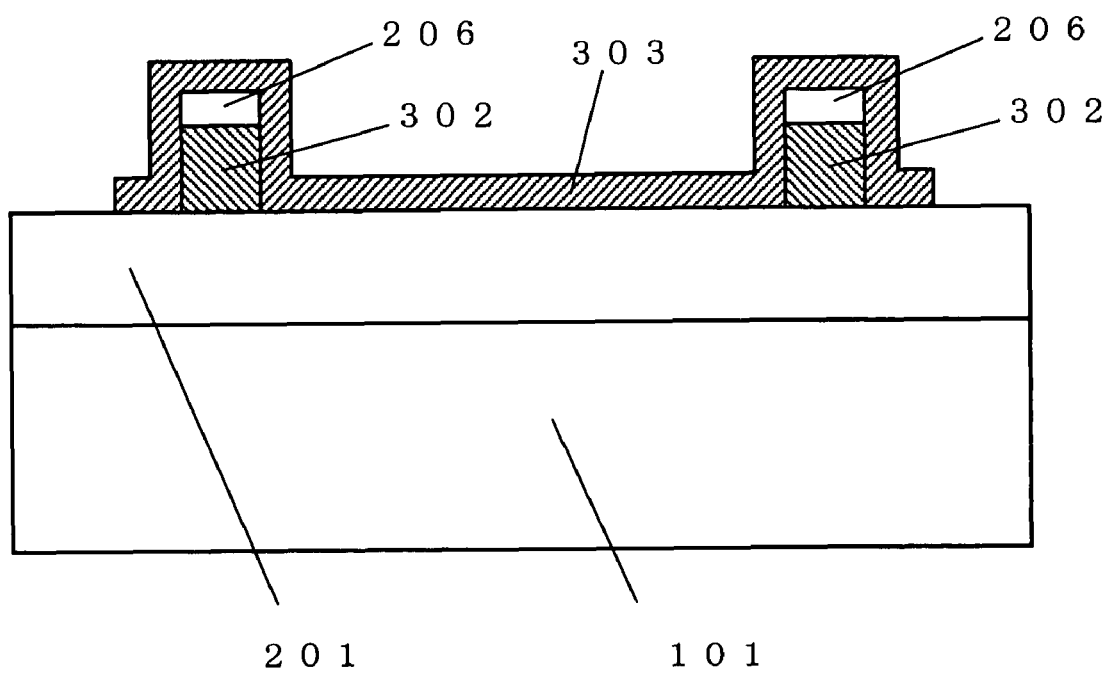
FIG. 15 is a schematic sectional view showing a semiconductor device according to a prior art.

In the above description, the film thickness of the polycrystalline silicon film 301 is 100 nm to 400 nm, but, as shown in FIG. 14, when a gate electrode 405 of a MOS transistor which is formed of the polycrystalline silicon film 301 is formed separately from the resistance region 404 formed above the semiconductor substrate 101, or when a wiring 406 formed of the polycrystalline silicon film 301 is formed, the film thickness of the polycrystalline silicon film 301 is set to about 400 nm, which is relatively thick, so that each resistivity of the gate electrode 405 and the wiring 305 is reduced. In this case, it is possible to form the gate electrode of the MOS transistor, the wiring, and the resistor using the same polycrystalline silicon film. Further, when the gate electrode of the MOS transistor or the wiring is formed using the first polycrystalline silicon film and the resistor is formed using the second polycrystalline silicon film, the film thickness of the second polycrystalline silicon film which becomes the resistor may be about 100 nm to 200 nm.

Figure 12:
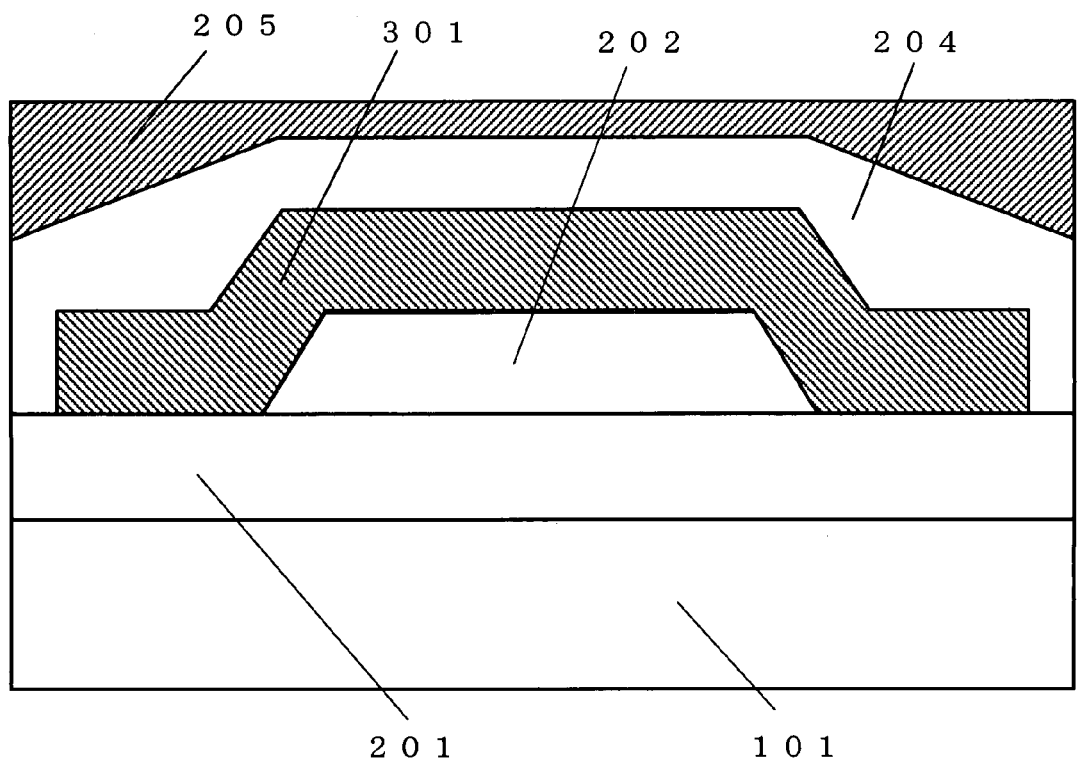
FIG. 12 is a schematic sectional view showing the second embodiment of the method of manufacturing a semiconductor device according to the present invention.

After that, the sacrificial oxide film 203 is removed, and the photo resist 401 is patterned in the photolithography process so that portions of the polycrystalline silicon film 301 other than a portion which becomes the resistance region of the resistor are openings. Then, by using the photo resist 401 as a mask, the polycrystalline silicon film 301 is etched to obtain a structure shown in FIG. 11. Next, after removing the photo resist 401, with employment of the etch-back method, the TEOS-based oxide film 204 is deposited by employing, for example, the CVD method, the SOG film 205 is further formed on the TEOS-based oxide film 204 to planarize a surface layer on the polycrystalline silicon film 301 as shown in FIG. 12, and then etching is performed. In this case, the etching is performed so as to finally planarize the SOG film 205, the TEOS-based oxide film 204, and the polycrystalline silicon film 301, and the etching is continuously performed until the polycrystalline silicon film 301 in the resistance region 402 has a desired thickness. The polycrystalline silicon film 301 in the resistance region 402 has a final thickness of about 10 nm to 90 nm, which depends on the thicknesses of deposited films. The etch-back method is performed after the patterning of the polycrystalline silicon film 301, so there is an effect in that the resistor, irregularities caused in the process before formation of the resistor, and the like are planarized.

In this case, as shown in FIG. 14, the gate electrode 405 of the MOS transistor is formed using the polycrystalline silicon film 301 and the polycrystalline silicon film 301 is patterned. Then, in a case where a source/drain 407 of the MOS transistor is to be formed, when an impurity is introduced from above the semiconductor substrate 101, for example, by the ion implantation method, there is a possibility that the impurity to be introduced does not reach the semiconductor substrate 101 due to the large thickness of the TEOS-based oxide film 204 or the SOG film 205. In this case, the TEOS-based oxide film 204 or the SOG film 205, which is left on the semiconductor substrate 101 may be removed.

Figure 13:
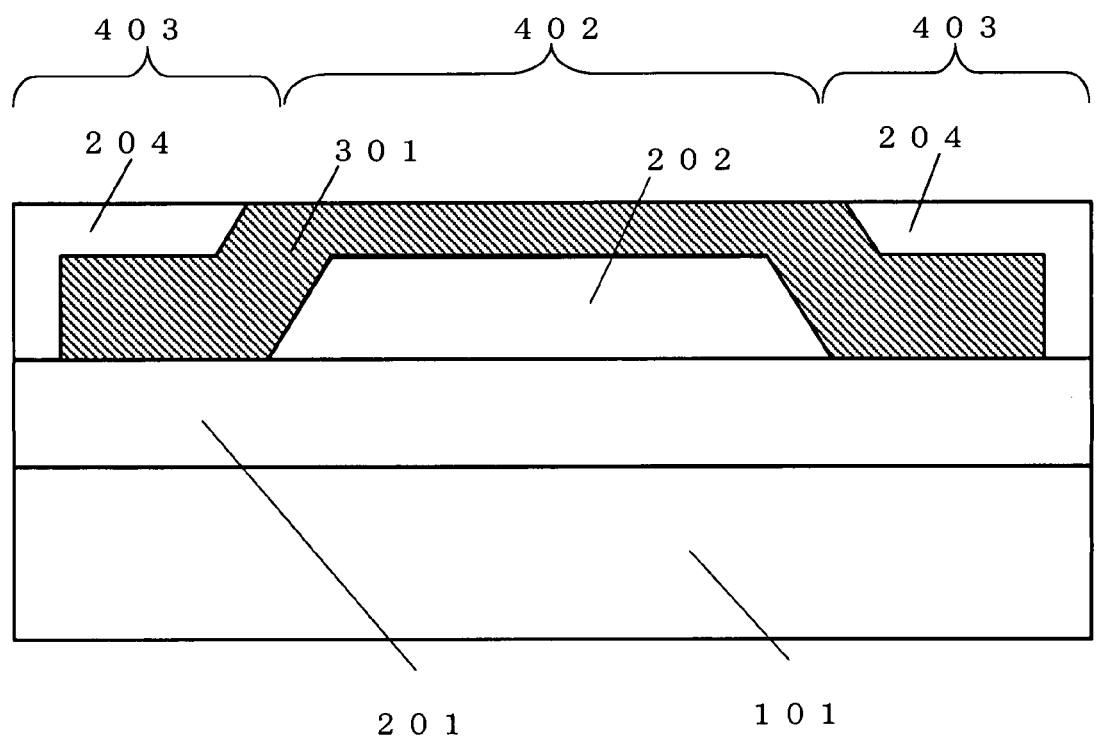
FIG. 13 is a schematic sectional view showing a second embodiment of a semiconductor device according to the present invention.

Through the above-mentioned processes, as shown in FIG. 13, on the field insulating film 201 formed on the semiconductor substrate 101, the oxide film 202 is formed under the region of the resistor which becomes the resistance region 402, and thus it is possible to obtain the resistor which is formed of the polycrystalline silicon film 301 and includes the resistance region 402 and the electrode lead-out regions 403 such that the resistance region 402 is thinner than each of the electrode lead-out regions 403. Since each of the electrode lead-out regions 403 is thick, there does not arise any problem of penetration in an opening for contact hole. Meanwhile, it is possible to obtain a resistor with a structure and characteristics having high accuracy, high resistivity, and a preferable temperature characteristic. In addition, it is possible to use the resistor as a resistor for a semiconductor device including not a single resistor but two or more resistors, fuse devices each of which is connected in parallel with each of the resistors, and a bleeder resistance circuit capable of adjusting a voltage output which is divided by the resistors through cutting-off of the fuse devices by laser trimming or the like. The resistor and the contact opening are formed as a continuum, and it is not necessary to perform a heat treatment process including re-diffusion of an impurity, so there is not any risk of arising problems of the conventional manufacturing method. In addition, the gate electrode of the MOS transistor or the wiring that are formed on the same semiconductor substrate can be formed using the same polycrystalline silicon film, so it is possible to suppress the number of manufacturing processes.

In this embodiment, as a manufacturing method for obtaining the structure shown in FIG. 13 from the structure shown in FIG. 12, the etch-back method by means of etching is employed. Alternatively, the CMP method may be employed to perform polishing and planarization, thereby making it possible to easily obtain the structure shown in FIG. 13.

What is claimed is:

1. A method of manufacturing a semiconductor device including a resistor, comprising the steps of:
   forming a first oxide film in a convex shape on a field insulating film;
   forming a polycrystalline silicon film on the first oxide film;
   introducing an impurity into the polycrystalline silicon film;
   patterning the polycrystalline silicon film into which the impurity is introduced so that a portion above the convex-shaped first oxide film becomes a resistance region of the resistor;
   forming a second oxide film on the patterned polycrystalline silicon film;
   forming a third oxide film on the second oxide film; and
   removing the third oxide film and parts of the second oxide film and the polycrystalline silicon film to form a planarized surface including surface portions of the second oxide film and the polycrystalline silicon film.

2. A method of manufacturing a semiconductor device according to claim 1; wherein the polycrystalline silicon film comprises a second polycrystalline silicon film; and wherein the step of forming the first oxide film comprises the steps of forming a first polycrystalline silicon film on the field insulating film, patterning the first polycrystalline silicon film to leave a portion of the first polycrystalline silicon film below a region of the resistor so that the portion of the first polycrystalline silicon film becomes a high resistance, and forming the first oxide film on the field insulating film and on the first polycrystalline silicon film, the resistor being formed of the first polycrystalline silicon film.

3. A method of manufacturing a semiconductor device according to claim 2; wherein the step of forming the first polycrystalline silicon film comprises forming the first polycrystalline silicon film with a film thickness in a range of 300 nm to 400 nm.

4. A method of manufacturing a semiconductor device according to claim 1; wherein the step of forming the polycrystalline silicon film comprises forming the polycrystalline silicon film with a film thickness in a range of 100 nm to 400 nm.

5. A method of manufacturing a semiconductor device according to claim 1; wherein the removing step is performed by an etch-back method.

6. A method of manufacturing a semiconductor device according to claim 1; wherein the removing step is performed by a CMP method.

7. A method of manufacturing a semiconductor device according to claim 1; wherein the introducing step comprises introducing the impurity into the polycrystalline silicon film at a concentration in a range of $1\times10^{14}/cm^2$ to $5\times10^{15}/cm^2$.

8. A method of manufacturing a semiconductor device according to claim 1; wherein the resistance region of the resistor has a final film thickness in a range of 10 nm to 90 nm.

9. A method of manufacturing a semiconductor device, comprising the steps of:
   forming a field insulating film on a surface of a semiconductor substrate;
   forming a base insulating film on a surface of the field insulating film;
   forming a polycrystalline silicon film on the base insulating film;
   introducing an impurity into the polycrystalline silicon film;
   patterning the polycrystalline silicon film into which the impurity is introduced so that a portion above the first oxide film becomes a resistance region of the resistor;
   forming a TEOS-based oxide film on the patterned polycrystalline silicon film;
   forming an SOG film on the TEOS-based oxide film; and
   removing the SOG film and parts of the TEOS-based oxide film and the polycrystalline silicon film to form a planarized surface including surface portions of the TEOS-based oxide film and the polycrystalline silicon film.

10. A method according to claim 9; wherein the step of forming the base insulating film comprises forming the base insulating film with a convex shape.

11. A method according to claim 9; wherein the step of forming the polycrystalline silicon film comprises forming the polycrystalline silicon film with a film thickness in a range of 100 nm to 400 nm.

12. A method according to claim 9, wherein the introducing step comprises introducing the impurity into the polycrystalline silicon film at a concentration in a range of $1\times10^{14}/cm^2$ to $5\times10^{15}/cm^2$ before the patterning step.

* * * * *